(12) United States Patent
Chen

(10) Patent No.: US 6,922,334 B1
(45) Date of Patent: Jul. 26, 2005

(54) DISPLAY PANEL ASSEMBLY FOR DISPLAYING AND MONITORING COMPUTER STATES AND STATES OF FANS OF THE COMPUTER

(75) Inventor: Michael Chen, Taipei (TW)

(73) Assignee: Aerocool Advanced Technologies Corp., Taipei (TW)

( * ) Notice: Subject to any disclaimer, the term of this patent is extended or adjusted under 35 U.S.C. 154(b) by 0 days.

(21) Appl. No.: 10/858,454

(22) Filed: Jun. 2, 2004

(51) Int. Cl.[7] .................................................. G06F 1/16
(52) U.S. Cl. ...................................... 361/681; 361/683
(58) Field of Search ................................ 361/679–687, 361/724–727; 248/917; 345/169, 905

(56) References Cited

U.S. PATENT DOCUMENTS 5,408,385 A * 4/1995 Fowler et al. .............. 361/784
5,715,136 A * 2/1998 Noe et al. ................... 361/681
6,643,126 B2 * 11/2003 Su .............................. 361/685
2004/0246675 A1 * 12/2004 Lin ............................. 361/686

* cited by examiner

Primary Examiner—Lynn Feild
Assistant Examiner—Zachary Pape

(57) ABSTRACT

A display panel assembly for displaying and monitoring computer states and states of the fan of the computer; the display panel assembly having an area which is twice of a 5¼ (five and one over four) receiving groove of a computer display panel. The display panel assembly comprises a machine case. The machine casing comprises a cartridge seat; a circuit substrate; a button panel; and a mask plate. In assembly, the mask plate covers upon the button panel so that the button holes are aligned to the buttons on the button sets. Then the mask plate covers upon the cartridge seat; then a plurality of screws passes through the through holes and the via holes of the vertical folding sheets, and the via holes of the circuit substrate so as to lock the cartridge seat, circuit substrate, button panel and mask plate together.

2 Claims, 4 Drawing Sheets

DISPLAY PANEL ASSEMBLY FOR DISPLAYING AND MONITORING COMPUTER STATES AND STATES OF FANS OF THE COMPUTER

FIELD OF THE INVENTION

The present invention relates to computer display panels, and particularly to a display panel assembly for displaying and monitoring computer states and states of fans of the computer. In the present invention, the panel has a larger area than the prior art and thus the user can operate it easily and conveniently.

BACKGROUND OF THE INVENTION

Generally, a computer panel is formed with a receiving groove of a specification of 5¼ (5.25) inches for receiving the operation display units of a power switch, a reset switch, a power indicator, a hard disk indicator, and a seven stage indicator. However the prior art design is dull. Moreover, the operation condition of the computer cannot be clearly displayed by above mentioned indicators, for example, it can not afford the function of temperature and time display and the function for changing the operations.

SUMMARY OF THE INVENTION

Accordingly, the object of the present invention is to provide a display panel assembly for displaying and monitoring computer states and the states of the fan of the computer. The display panel assembly has an area which is twice of a 5¼ (five and one over four) receiving groove of a computer display panel. The display panel assembly comprises a machine case. The machine casing comprises a cartridge seat; a circuit substrate; a button panel; and a mask plate. In assembly, the mask plate covers upon the button panel so that the button holes are aligned to the buttons on the button sets. Then the mask plate covers upon the cartridge seat; then a plurality of screws passes through the through holes and the via holes of the vertical folding sheets, and the via holes of the circuit substrate so as to lock the cartridge seat, circuit substrate, button panel and mask plate together.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
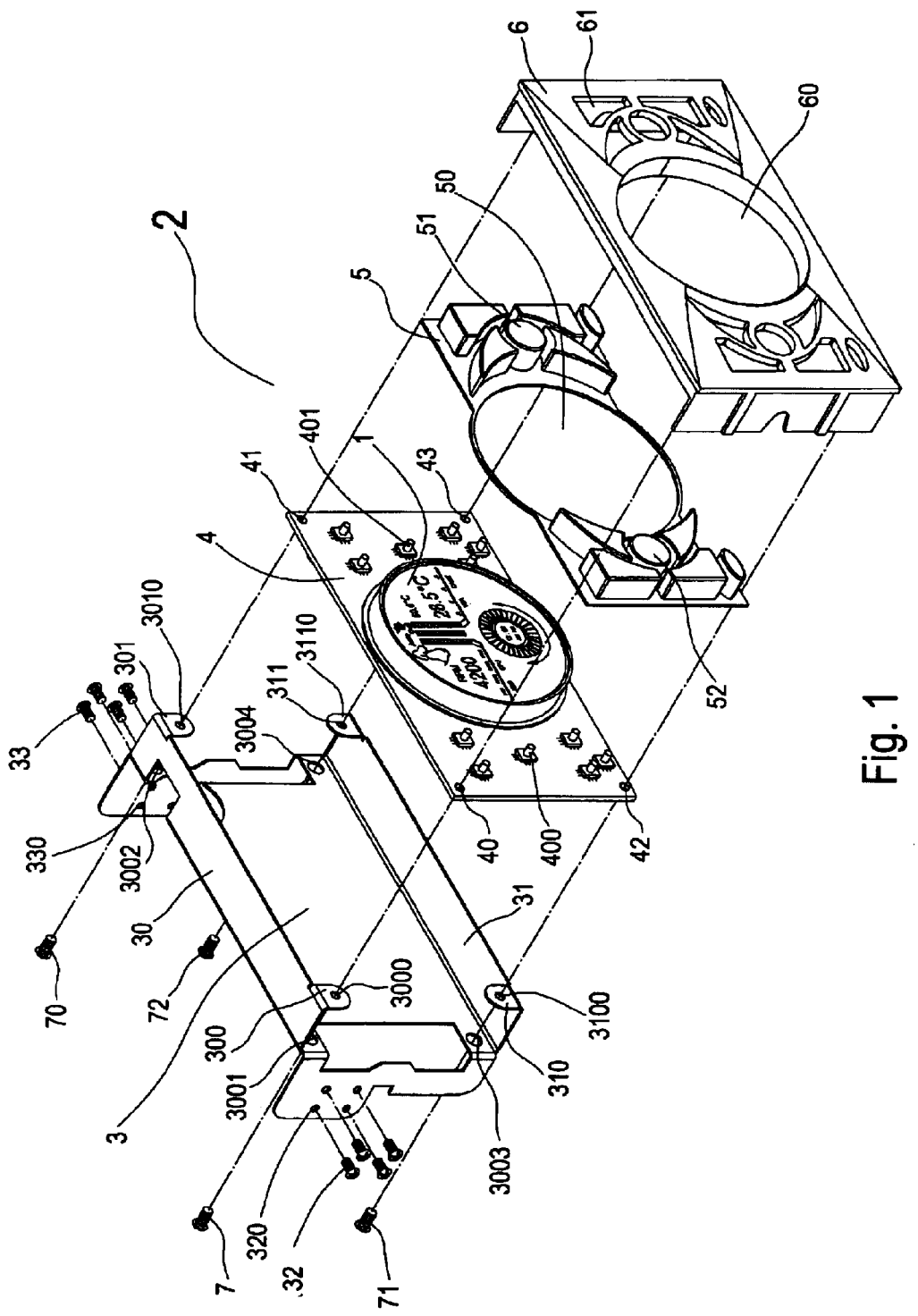
FIG. 1 is an exploded perspective view of the machine case of the present invention.
Figure 2:
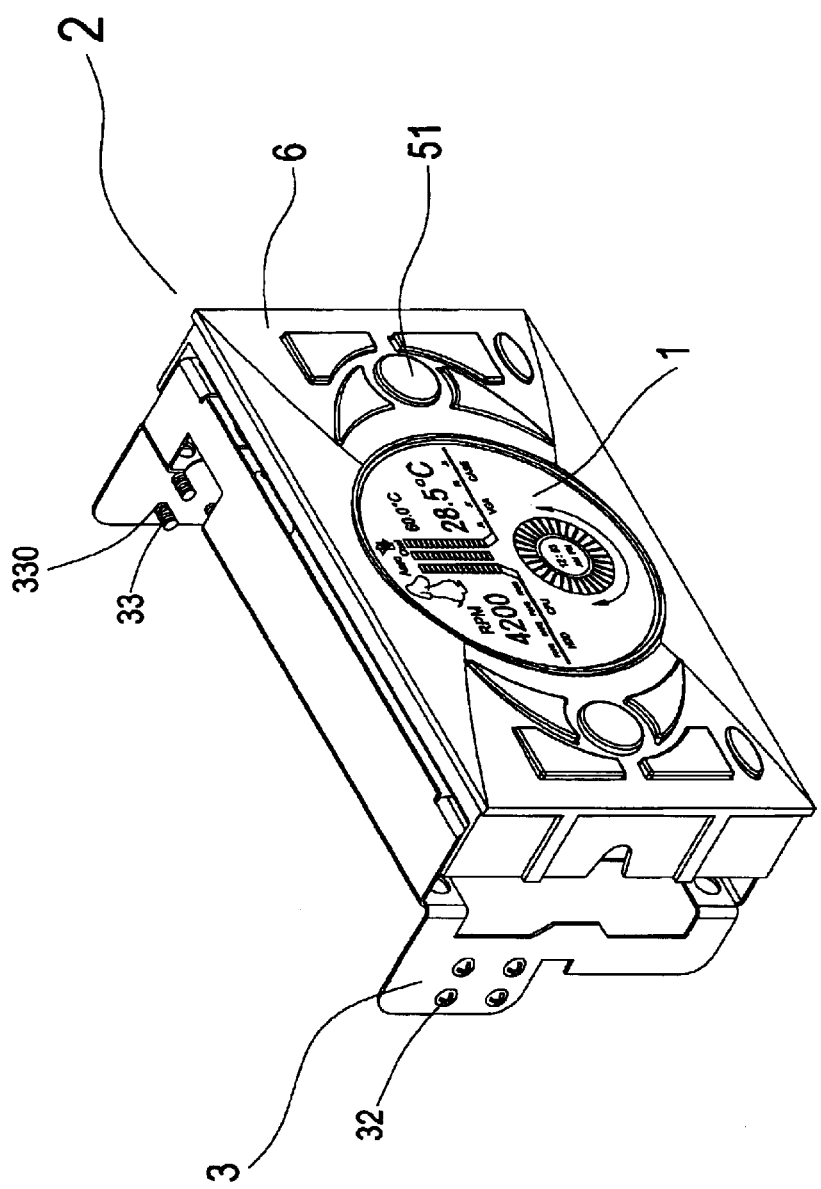
FIG. 2 is an assembled view of the machine case of the present invention.
Figure 3:
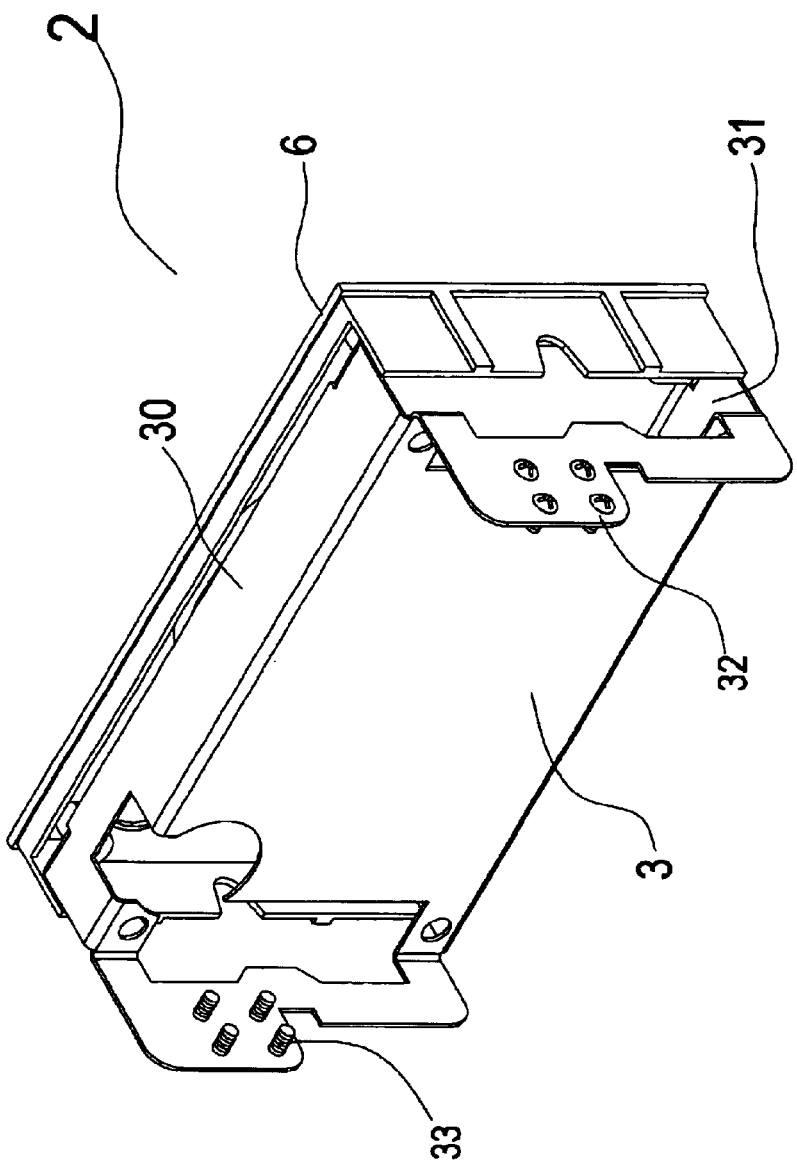
FIG. 3 is a structural perspective view of the machine case of the present invention.

With reference to FIGS. 1, 2, and 3, a display panel assembly for displaying and monitoring the computer state and the state of the fan of the computer is illustrated; the display panel assembly having an area which is twice of a 5¼ (five and one over four) receiving groove of a computer display panel. The display panel assembly has a machine case 2. The computer case comprises the following elements.

A cartridge seat 3 is at a rear end of the computer casing 2. Two opposite sides of cartridge seat 3 are formed with a plurality of through holes 320, 330. A plurality of screws 32, 33 are installed at two side of the cartridge seat 3. A first and a second horizontal folding edges 30, 31 are folded from another two opposite sides of the cartridge seat 3. Two vertical folding sheets 300, 301 are folded from two sides of the first horizontal folding edge 30 and two vertical folding sheets 310, 311 corresponding to the vertical folding sheets 300, 301 are folded from two sides of the second horizontal folding edge 31. Each of the vertical folding sheets has a semi-round shape. Each of the vertical folding sheets 300, 301, 310, 311 is formed with via hole 3000, 3010, 3100, 3110. The via holes 3000, 3010, 3100, 3110 are corresponding to through holes 3001, 3002, 3003 and 3004 at a bottom of the cartridge seat 3.

A circuit substrate 4 has four through holes 41, 42, 43 and 44 which are corresponding to the via hole 3000, 3010, 3100, 3110 of the vertical folding sheets 300, 301, 310, 311, respectively. A center of the circuit substrate 4 is installed with a computer fan monitoring display panel 1 which is a liquid crystal backlight panel. Two sides of the circuit substrate 4 have switch sets 400, 401, respectively.

A button panel 5 is adhered to a front side of the circuit substrate 4. Two sides of the button panel 5 have button sets 51, 52, respectively, which are corresponding to the switch sets 400, 401. A center of the button panel 5 is installed with a larger hole 50 for receiving the computer fan monitoring display panel 1 so that the button panel 5 is adhered to the circuit substrate 4.

A mask plate 6 is installed at a front end of the machine case 2. A center of the mask plate 6 has a mask hole 60. Two sides of the mask plate 6 are formed with respective button holes 61 corresponding to the button sets 51, 52 of the button panel 5. The button arrangements at the button sets 51, 52 are symmetrically.

In assembly, the mask plate 6 covers upon the button panel 5 so that the button holes 61 are aligned to the buttons on the button sets 51, 52. Then the mask plate 6 covers upon the cartridge seat 3. Thereby screws 7, 70, 71, 72 passes through the through holes 3001, 3002, 3003, 3004 and the via holes 3000, 3010, 3100, 3110 of the vertical folding sheets 300, 301, 310, 311, respectively, and the respective via holes 40, 41, 42, 43 of the circuit substrate 4 so as to lock the cartridge seat 3, circuit substrate 4, button panel 5 and mask plate 6 together.

Figure 4:
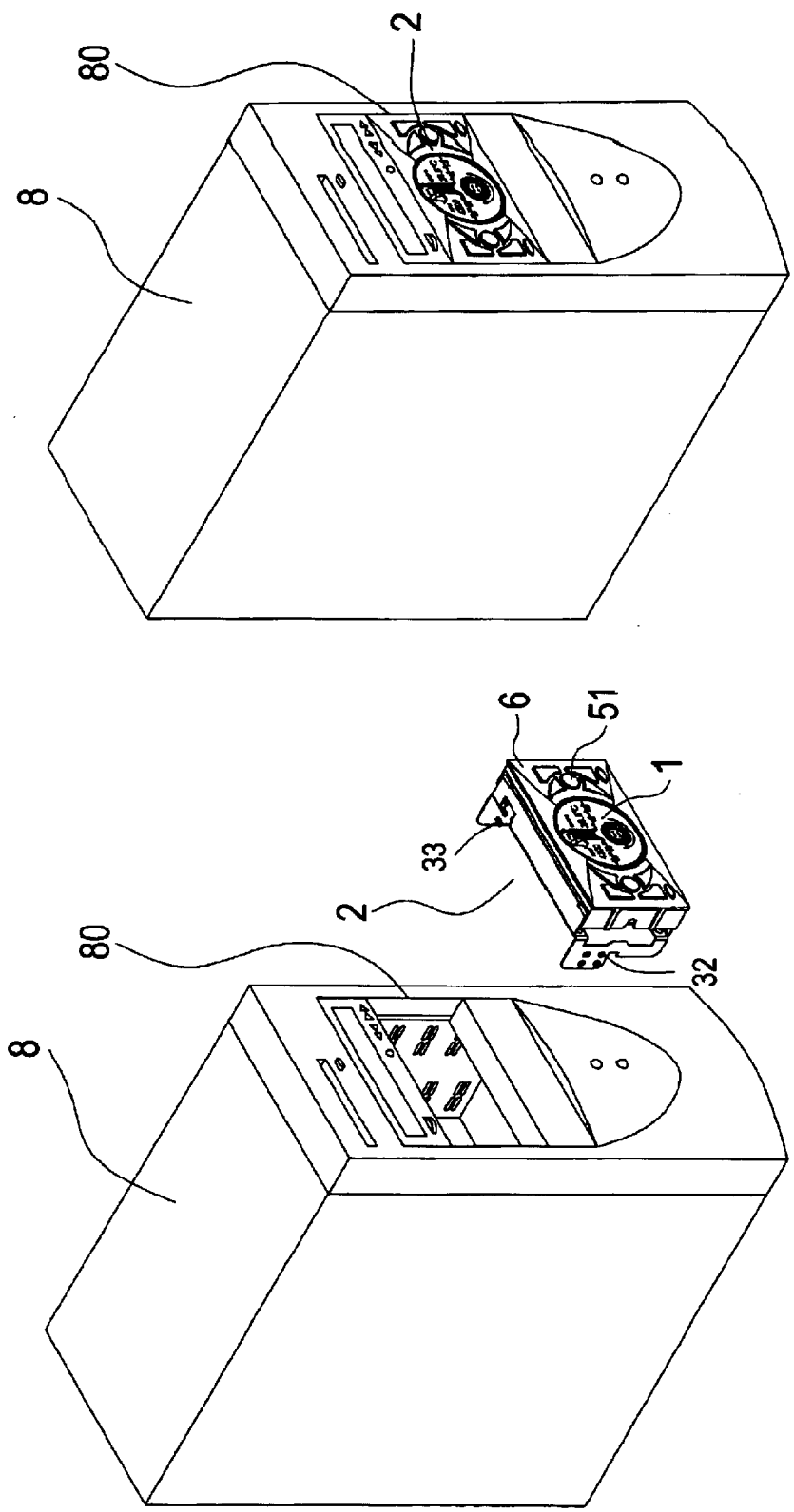
FIG. 4 shows the embodiment of the machine case of the present invention.

Referring to FIG. 4, in the present invention, the height of the machine case 2 occupies two 5¼ inches (5.25 inches) receiving grooves 80. Thereby the operation area of the machine case 2 of the present invention is larger than those used in the prior art. The screws 32, 33 of the cartridge seat 3 causes that the machine case 2 can be locked to the groove 80. Thereby the user can operate the buttons easily.

Advantages of the present invention is that the area of the machine case 2 is larger than that of the present invention and thus the operator can operate and monitor the conditions of the computer easily and clearly. Moreover, the present invention can be assembled and detached easily and conveniently.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A display panel assembly for displaying and monitoring computer states and states of the fan of the computer; the display panel assembly having an area which is twice of a 5¼ inch (five and one over four) receiving groove of a computer display panel; the display panel assembly comprising a machine case; the machine case comprising:

a cartridge seat being at a rear side of the computer casing; two opposite sides of the cartridge seat being formed with a plurality of through holes; a plurality of screws being installed at two side of the cartridge seat;

a first and a second horizontal folding edges being folded from the another two opposite sides of the cartridge seat; two first vertical folding sheets being folded from two sides of the first horizontal folding edge and two second vertical folding sheets being folded from two sides of the second horizontal folding edge; each of the first and second vertical folding sheets having a semi-round shape; and each of the first and second vertical folding sheets being formed with respective via holes which are corresponding to through holes at a bottom of the cartridge seat;

a circuit substrate having four through holes which are corresponding to the via holes of the vertical folding sheets, respectively; a center of the circuit substrate being installed with a computer fan monitoring display panel; two sides of the circuit substrate having switch sets, respectively;

a button panel adhered to a front side of the circuit substrate; two sides of the button panel having button sets, respectively, which are corresponding to the switch sets of the circuit substrate; a center of the button panel being installed with a larger hole for receiving the computer fan monitoring display panel so that the button panel is adhered to the circuit substrate;

a mask plate installed at a front end of the machine case; a center of the mask plate having a mask hole; two sides of the mask plate being formed with respective button holes corresponding to the button sets of the button panel; the button arrangements at the button sets being symmetrical;

wherein in assembly, the mask plate covers upon the button panel so that the button holes are aligned to the buttons on the button sets; then the mask plate covers upon the cartridge seat; then a plurality of screws passes through the through holes and the via holes of the vertical folding sheets, and the via holes of the circuit substrate so as to lock the cartridge seat, circuit substrate, button panel and mask plate together.

2. The display panel assembly for displaying and monitoring computer states and states of the fan of the computer as claimed in claim 1, wherein the computer fan monitoring display panel is a liquid crystal backlight panel.

* * * * *